(12) United States Patent
Arai et al.

(10) Patent No.: US 10,771,659 B2
(45) Date of Patent: Sep. 8, 2020

(54) ELECTRONIC APPARATUS AND IMAGE PICKUP APPARATUS IMPROVED IN HEAT DISSIPATION STRUCTURE

(71) Applicant: CANON KABUSHIKI KAISHA, Tokyo (JP)

(72) Inventors: Naohiro Arai, Kawasaki (JP); Shintaro Komori, Tokyo (JP); Ayumu Kawamura, Tokyo (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 0 days.

(21) Appl. No.: 16/002,451

(22) Filed: Jun. 7, 2018

(65) Prior Publication Data
US 2018/0376037 A1    Dec. 27, 2018

(30) Foreign Application Priority Data

Jun. 22, 2017  (JP) .................................. 2017-122215
Jun. 22, 2017  (JP) .................................. 2017-122217
Jun. 22, 2017  (JP) .................................. 2017-122219

(51) Int. Cl.
*H04N 5/225*    (2006.01)
*G03B 17/55*    (2006.01)
(Continued)

(52) U.S. Cl.
CPC ........... *H04N 5/2252* (2013.01); *G03B 17/55* (2013.01); *H05K 7/20145* (2013.01);
(Continued)

(58) Field of Classification Search
None
See application file for complete search history.

(56) References Cited

U.S. PATENT DOCUMENTS

2005/0084252 A1*  4/2005  Satou ................. G11B 17/0405
                                                    386/230
2006/0056049 A1*  3/2006  Tokiwa .................. G02B 13/16
                                                    359/684
(Continued)

FOREIGN PATENT DOCUMENTS

JP        2008103491 A    5/2008
JP        2009071722 A    4/2009
(Continued)

OTHER PUBLICATIONS

Office Action issued in Japanese Appln. No. 2017-122215 dated Apr. 16, 2019.

*Primary Examiner* — Twyler L Haskins
*Assistant Examiner* — Dwight Alex C Tejano
(74) *Attorney, Agent, or Firm* — Rossi, Kimms & McDowell LLP

(57) ABSTRACT

An electronic apparatus capable of efficiently cooling first and second circuit boards, using one cooling fan. A main circuit board is arranged substantially in parallel to a side surface of a casing. A sensor circuit board is arranged orthogonal to the side surface of the camera casing. A main duct is formed with a flow passage for cooling the main circuit board. A sensor duct has an exhaust port and is formed with a flow passage for cooling the sensor circuit board. A cooling fan is fixed to the main duct and has an exhaust port for discharging air flowing into the flow passage of the main duct. The main duct is formed with an opening connected to the exhaust port of the sensor duct, and introduces air discharged from the exhaust port of the sensor duct into the flow passage of the main duct.

29 Claims, 14 Drawing Sheets

(51) Int. Cl.
*H05K 7/20* (2006.01)
*G03B 17/56* (2006.01)

(52) U.S. Cl.
CPC ..... *H05K 7/20172* (2013.01); *H05K 7/20409* (2013.01); *G03B 17/563* (2013.01)

(56) References Cited

U.S. PATENT DOCUMENTS

| | | | | |
|---|---|---|---|---|
| 2008/0055420 | A1* | 3/2008 | Orihashi | H04N 5/2253 348/208.4 |
| 2008/0074509 | A1* | 3/2008 | Sano | G03B 17/55 348/231.3 |
| 2009/0016710 | A1* | 1/2009 | Nozaki | G03B 17/18 396/159 |
| 2012/0050608 | A1* | 3/2012 | Makara | H04N 5/2251 348/373 |
| 2013/0162893 | A1* | 6/2013 | Hirota | H04N 5/225 348/360 |
| 2014/0055671 | A1* | 2/2014 | Kawamura | H04N 5/2252 348/374 |
| 2016/0295095 | A1* | 10/2016 | Jannard | H04N 5/2252 |

FOREIGN PATENT DOCUMENTS

| | | |
|---|---|---|
| JP | 2009152326 A | 7/2009 |
| JP | 2009296469 A | 12/2009 |

* cited by examiner

ELECTRONIC APPARATUS AND IMAGE PICKUP APPARATUS IMPROVED IN HEAT DISSIPATION STRUCTURE

BACKGROUND OF THE INVENTION

Field of the Invention

The present invention relates to an electronic apparatus and an image pickup apparatus, such as a digital camera and a digital video camera, and more particularly to an improved heat dissipation structure of the electronic apparatus and the image pickup apparatus.

Description of the Related Art

An electronic apparatus, such as a digital video camera, has increased its power consumption in accordance with the increased number of pixels of an image pickup device in recent years, and is required to have a structure having a higher heat dissipation effect for the image pickup device. For example, there has been proposed a structure for circulating heat of the image pickup device within a camera body through an air circulation passage formed by a fan and an air duct, and further, dissipating the heat transferred to a heat dissipation member forming part of the air circulation passage to the outside via through holes formed in the camera body (see Japanese Laid-Open Patent Publication (Kokai) No. 2009-71722). There has been also proposed a structure for cooling a main circuit board provided in an image pickup apparatus body using a fan and an air duct (see Japanese Laid-Open Patent Publication (Kokai) No. 2008-103491).

On the other hand, an increasing number of models of the image pickup apparatus, such as the digital video camera, have come to employ a forced cooling structure to cope with the increased power consumption, even in a case where the apparatus is of a type compact in size. From a viewpoint of downsizing the image pickup apparatus of this type, it is important how to arrange a heat dissipation structure body and a card board on which a connector for a memory card is mounted, with respect to a camera casing. Conventionally, for example, there has been proposed a technique for reducing the size of an image pickup apparatus by arranging a cooling fan and a card board substantially in parallel to each other on respective planes on the rear side of the camera casing, which are opposed to a photographer (see Japanese Laid-Open Patent Publication (Kokai) No. 2009-296469).

Incidentally, assuming a case where both of the image pickup device and the main circuit board within the camera body are cooled, it is desirable that the image pickup device and the main circuit board can be simultaneously cooled using only one fan from the viewpoints of size reduction of the camera body and cost reduction. However, compared with a case where only one of the image pickup device and the main circuit board is cooled using one fan, the heat dissipation effect is reduced, and hence, to simultaneously cool both of the image pickup device and the main circuit board using only one fan, a structure having a higher heat dissipation efficiency is required.

Further, in the case of a compact-type image pickup apparatus employing the forced cooling structure, it is desirable that a heavy component, such as a cooling fan, is disposed at a location corresponding to a holding portion, considering the weight balance when holding the image pickup apparatus. However, the technique disclosed in Japanese Laid-Open Patent Publication (Kokai) No. 2009-296469 has a problem that if a heavy component, such as a cooling fan, is disposed at a location corresponding to the holding portion, the whole image pickup apparatus is increased in size.

Further, in the above-mentioned conventional technique, when the user grips (holds) the image pickup apparatus, the user may erroneously cover a ventilation portion formed in an exterior, such as an exhaust port, with his/her hand. Further, the user has to perform photographing, gripping the image pickup apparatus while taking care not to cover the ventilation portion with his/her hand, which makes the image pickup apparatus not easy to grip.

SUMMARY OF THE INVENTION

The present invention is made to meet technical demands to overcome the problems described above, and provides an electronic apparatus and an image pickup apparatus, which have a heat dissipation structure that makes it possible to efficiently cool a first circuit board as a heat source and a second circuit board which is disposed on a plane orthogonal to a plane on which the first circuit board is disposed, simultaneously using one cooling fan.

In a first aspect of the present invention, there is provided an electronic apparatus comprising a body unit, a first circuit board that is arranged substantially in parallel to a side surface of the body unit and is a heat source, a second circuit board that is disposed on a plane orthogonal to the side surface of the body unit and is a heat source, a first duct that has a first intake port and has a flow passage formed therein for cooling the first circuit board, a second duct that has a second intake port and a first exhaust port and has a flow passage formed therein for cooling the second circuit board, and a cooling fan that is attached to the first duct and has a second exhaust port for discharging air flowing into the flow passage of the first duct, wherein the first duct is provided with an opening that is connected to the first exhaust port of the second duct and introduces air discharged from the first exhaust port of the second duct into the flow passage of the first duct.

In a second aspect of the present invention, there is provided an image pickup apparatus comprising a body unit, a first circuit board that is arranged substantially in parallel to a side surface of the body unit, a second circuit board that is disposed on a plane orthogonal to the first circuit board, a first duct that is arranged to be in contact with the first circuit board, a second duct that is connected to the first duct, and is arranged to be in contact with the second circuit board, and a cooling fan that is attached to the first duct.

In a third aspect of the present invention, there is provided an image pickup apparatus comprising a body unit, a first circuit board that is arranged substantially in parallel to a side surface of the body unit, a first duct that is arranged to be in contact with the first circuit board, and a cooling fan that is attached to the first duct such that a rotational axis thereof is substantially perpendicular to the first circuit board.

The heat dissipation structure of the electronic apparatus according to the present invention makes it possible to efficiently cool the first circuit board as a heat source and the second circuit board which is disposed on the plane orthogonal to the plane on which the first circuit board is disposed, simultaneously using one cooling fan.

Further features of the present invention will become apparent from the following description of exemplary embodiments (with reference to the attached drawings).

DESCRIPTION OF THE EMBODIMENTS

The present invention will now be described in detail below with reference to the accompanying drawings showing embodiments thereof.

Figure 1A:
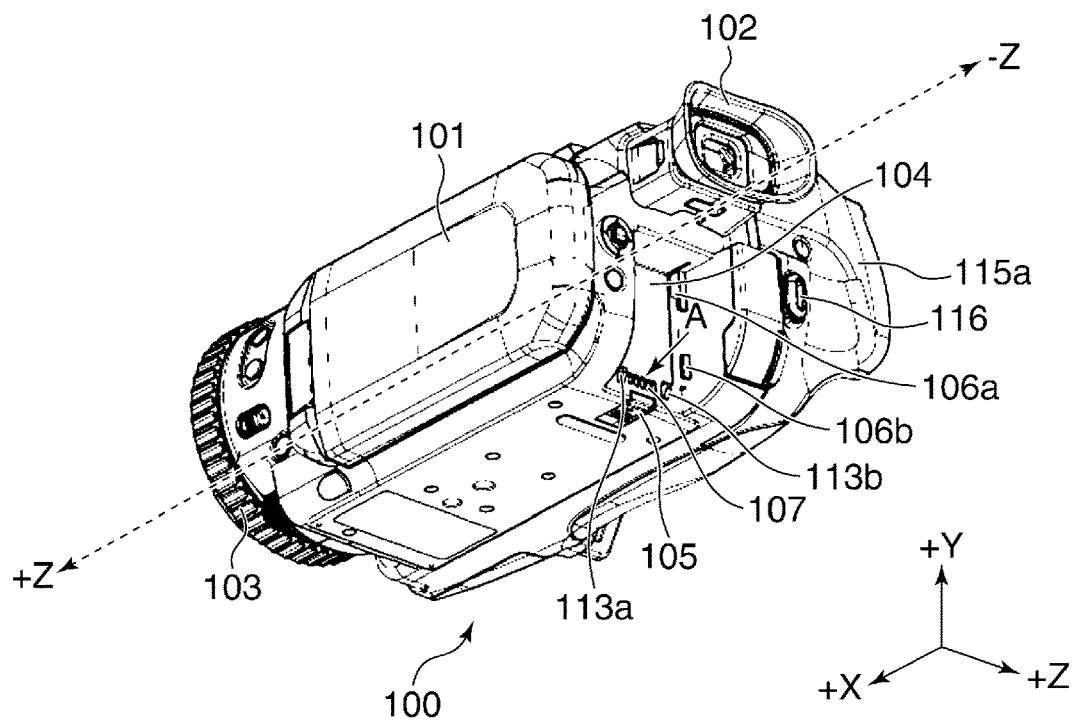
FIG. 1A is a perspective view of a digital video camera as an image pickup apparatus (electronic apparatus) according to a first embodiment of the invention, as viewed obliquely from below and the rear.
Figure 1B:
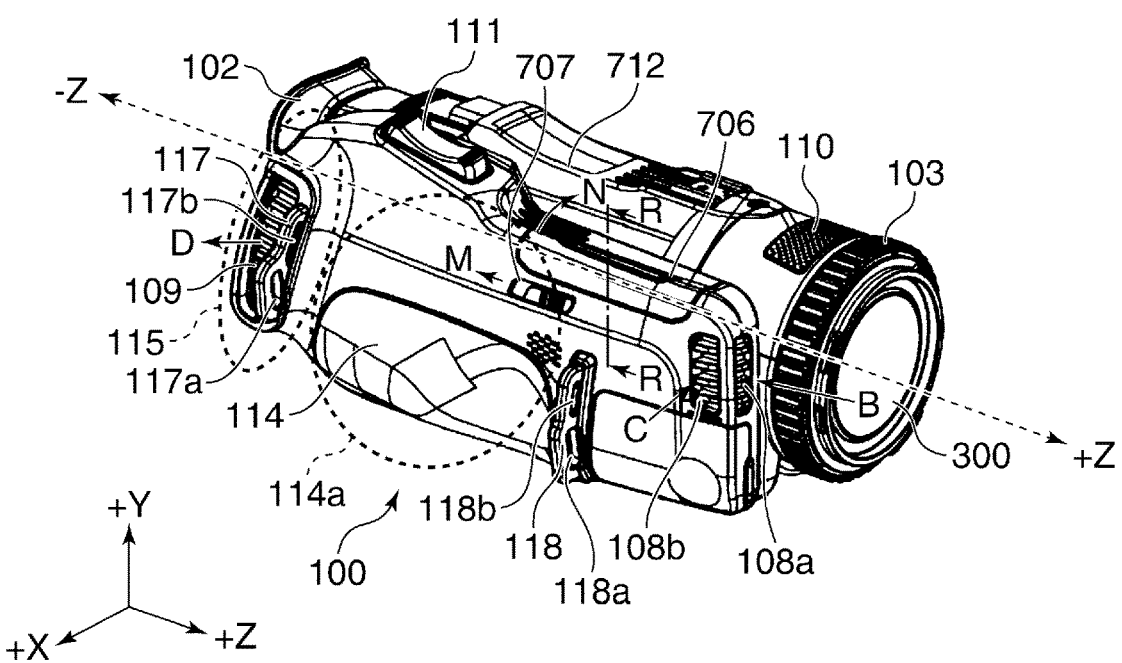
FIG. 1B is a perspective view of the digital video camera, shown in FIG. 1A, as viewed obliquely from above and the front.
Figure 2:
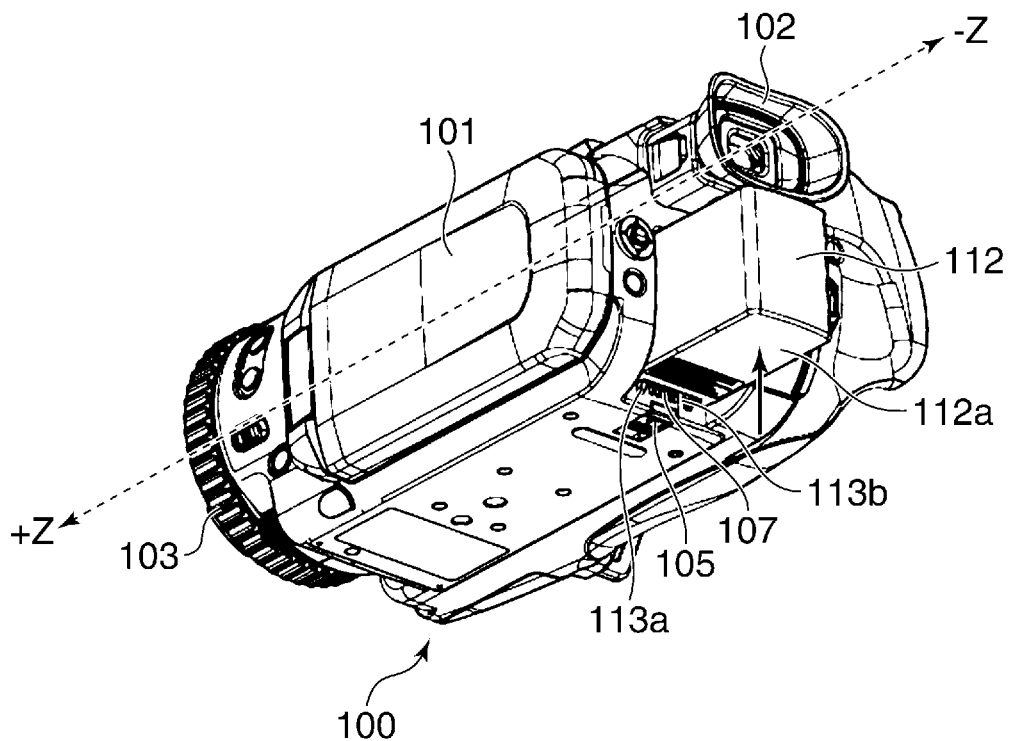
FIG. 2 is a perspective view of the digital video camera, shown in FIG. 1A, in a state having a battery attached thereto.

FIG. 1A is a perspective view of a digital video camera as an electronic apparatus (image pickup apparatus) according to a first embodiment of the invention, as viewed obliquely from below and the rear. FIG. 1B is a perspective view of the digital video camera, shown in FIG. 1A, as viewed obliquely from above and the front. FIG. 2 is a perspective view of the digital video camera, shown in FIG. 1A, in a state having a battery attached thereto. Note that in the drawings, a symbol Z denotes an optical axis, and the description is given by defining a direction toward an object (front side) as a +Z direction and a direction toward a photographer (rear side) as a −Z direction. Further, a direction denoted by a symbol X indicates a width direction, and a direction toward leftward, as viewed from the object side, is defined as a +X direction, and a direction toward rightward, as viewed from the object side is defined as a −X direction. Further, a symbol Y denotes a height direction, and a direction toward upward is defined as a +Y direction, and a direction toward downward is defined as a −Y direction.

As shown in FIGS. 1A and 1B, the digital video camera, denoted by reference numeral 100, (hereinafter referred to as the camera 100) according to the present embodiment has a lens part 300 arranged on the front side thereof, and an operation ring 103 which enables the user to perform a manual focusing operation and like operations is provided around an outer periphery of the lens part 300. A display section 101, which is implemented by an LCD or the like, is supported on a left side of the camera 100, as viewed from the rear, such that it can be opened and closed. Reference numeral 200 (see FIG. 4A) denotes a camera casing, which corresponds to a body unit of the present invention.

On the rear side of the camera 100, there are disposed a viewfinder 102, a battery chamber 104, a battery release switch 105, a recording button 116, battery attachment guides 106a and 106b, a battery chamber intake port 107, and battery locking portions 113a and 113b. Although not shown, the same components as the battery attachment guides 106a and 106b are also disposed in the battery chamber 104 on a side opposed to the battery attachment guides 106a and 106b.

On a left side of the camera 100 as viewed from the front, there is disposed a first grip part 114 as an exterior cover of the present invention, which includes a grip main surface 114a held by the user and forms part of the exterior. The first grip part 114 has main intake ports 108a and 108b formed at respective locations toward the front of the camera 100, and a second grip part 115 and an exhaust port 109 provided at respective locations toward the rear of the camera 100. At respective locations upward of the first grip part 114, there are disposed a card cover 706 and a card cover-opening/closing switch 707. By sliding the card cover-opening/closing switch 707 in the direction of arrow M, the card cover 706 can be opened in the direction of arrow N. Further, on a top cover 712 of the camera 100, there are disposed a microphone section 110 at a location toward the front of the camera 100, and a zoom key 111 at a location toward the rear of the camera 100.

A first grip belt holder 117 is provided on a side of the exhaust port 109 toward the first grip part 114 in a region of the second grip part 115. The first grip belt holder 117 is formed with a hole 117a for inserting a grip belt, not shown, and a hole 117b for inserting a strap belt, not shown, and the hole 117b is arranged upward of the hole 117a.

Further, a second grip belt holder 118 is arranged on a side of the first grip part 114 toward the main intake port 108b. The second grip belt holder 118 is formed with a hole 118a for inserting the grip belt, and a hole 118b for inserting the strap belt, and the hole 118b is arranged upward of the hole 118a.

The grip belt which is inserted through the hole 117a and the hole 118a is a belt for holding the user's hand gripping the camera 100. Further, opposite ends of the strap belt are inserted through the hole 117b and the hole 118b, respectively, and are fixed to the camera 100. This enables the user to carry the camera by hanging the same on his/her shoulder using the strap belt.

Further, the hole 117a for inserting the grip belt and the hole 117b for inserting the strap belt are formed in the same first grip belt holder 117, and are arranged in the vicinity of each other. With this arrangement, compared with a case where the hole 117a and the hole 117b are formed at distant separate locations, the number of portions of the camera 100, which require strength, is reduced, and hence it is possible to reduce the size of the camera 100. Similarly, the hole 118a for inserting the grip belt and the hole 118b for inserting the strap belt are formed in the same second grip belt holder 118, and are arranged in the vicinity of each other. With this arrangement, compared with a case where the hole 118a and the hole 118b are formed at distant separate locations, the number of portions of the camera 100, which require strength, is reduced, and hence it is possible to reduce the size of the camera 100.

The holes 117b and 118b for inserting the strap belt are disposed at respective locations upward of the holes 117a and 118a for inserting the grip belt, in a height direction of the camera 100. The holes 117b and 118b for inserting the strap belt each have a slot shape which is long in the height direction (vertical direction) of the camera 100, orthogonal to the optical axis (Z axis). The holes 117a and 118a for inserting the grip belt each have a slot shape having a top end side inclined outward in a width direction of the camera 100 with respect to the holes 117b and 118b for inserting the strap belt. With this arrangement, the user can use the belts without being impaired in the use feeling of each of the grip belt and the strap belt.

Further, the holes 117b and 118b for inserting the strap belt are arranged at respective locations spaced from each other in the vertical direction of the camera 100 across the optical axis, i.e. with the optical axis (Z axis) therebetween with respect to the vertical position. The optical axis extends substantially in the vicinity of the gravity center of the camera casing 200, and hence when the user carries the camera 100 using the strap belt, the camera 100 is made stable and is easy to carry.

The main intake ports 108a and 108b are connected to an intake port 902c (see FIG. 11B) of a duct unit 900, described hereinafter, and the exhaust port 109 is connected to an exhaust port 904a of the duct unit 900 (see FIG. 11B). Therefore, outside air is drawn into the camera 100 from the battery chamber intake port 107 in the direction of arrow A and from the main intake ports 108a and 108b in the directions of arrow B and arrow C, and is discharged from the exhaust port 109 in the direction of arrow D, whereby the inside of the camera 100 is cooled. The direction of arrow D is an outward direction of the width direction of the camera 100, which is orthogonal to a direction in which the recording button 116 is pushed in (optical axis direction). The recording button 116 corresponds to an operation button of the present invention, and can be subjected to a pushing-in operation with a user's thumb.

Figure 3:
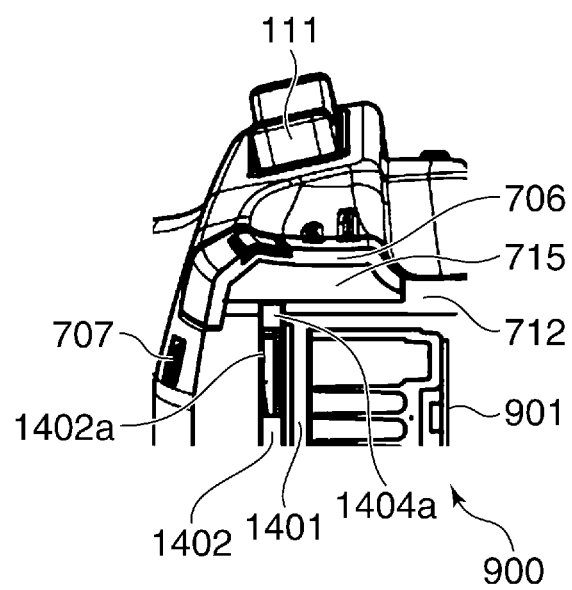
FIG. 3 is a cross-sectional view taken along R-R in FIG. 1B.

FIG. 3 is a cross-sectional view taken along R-R in FIG. 1B. As shown in FIG. 3, the top cover 712 is provided above a connector opening 1402a of a card connector 1402, referred to hereinafter, and the connector opening 1402a is covered by the top cover 712 except a card slot 1404a having substantially the same opening area as that of the connector opening 1402a. Portions of the top cover 712 which are close to a main circuit board 901, described hereinafter, and the duct unit 900, are liable to be increased in temperature due to heat generated by the main circuit board 901 and the duct unit 900.

However, a space 715 is formed between the card cover 706 and the top cover 712, and hence heat generated by the main circuit board 901, the duct unit 900, and so forth, within the camera 100 is insulated by an air layer of the space 715. This makes it possible to reduce heat transferred to the card cover 706, and ease an uncomfortable feeling felt by the photographer when he/she holds the camera 100 and touches the card cover 706.

Referring again to FIGS. 1A and 1B, and 2, the grip main surface 114a is part of the first grip part 114, and is a surface with which the user's palm is mainly brought into contact. The second grip part 115 includes an extended portion 115a formed to extend from a surface of the camera 100, on which the recording button 116 is provided, in the direction of arrow D, and the extended portion 115a has a shape protruding from the grip main surface 114a in the direction of arrow D, as viewed from the optical axis direction. The user can hold the camera 100 by gripping the second grip part 115 between his/her thumb and forefinger, and also can easily hold the camera 100 by gripping the same with his/her fingers except the thumb, placed to hold the upper part of the camera 100, and his/her palm placed to be brought into contact with the grip main surface 114a. Further, the user can easily perform a pushing-in operation of the recording button 116 while holding the camera 100.

Further, the exhaust port 109 as a ventilation portion is disposed in the second grip part 115, and hence in the state of the camera 100 in which the second grip part 115 is gripped by the user, the exhaust port 109 is located in a space between the thumb and the forefinger. Therefore, it is possible to prevent the user from erroneously covering the exhaust port 109 when gripping the second grip part 115. Further, the first grip belt holder 117 is disposed in the region of the second grip part 115 at a location closer to the object than the exhaust port 109, and the grip main surface 114a is located between the first grip belt holder 117 and the second grip belt holder 118. Therefore, it is possible to prevent the user from erroneously covering the exhaust port 109 when holding the camera 100 with the fingers and the palm.

Thus, the first grip belt holder 117 is arranged between the user's forefinger and the exhaust port 109, whereby it is possible to prevent the forefinger of the user holding the camera 100 from covering the exhaust port 109. Further, the grip belt itself, not shown, is also disposed at a location less liable to cover the exhaust port 109.

Further, the first grip belt holder 117 is constructed such that the surface of a metal member for ensuring strength is at least partially covered with resin. The at least partially covered portion of the surface includes a portion which can be touched by the user's hand or the like. The resin is low in heat conductivity, and hence even when hot air discharged from the exhaust port 109 is blown against the first grip belt holder 117, the first grip belt holder 117 is less liable to become hot. With this construction, the first grip belt holder 117 is less liable to cause an uncomfortable feeling to be felt by the user due to heat when he/she touches the first grip belt holder 117, while ensuring the strength thereof.

The battery locking portions 113a and 113b are urged in the −Z direction by an elastic member, not shown, to protrude from the battery chamber 104 when in the normal state. The battery release switch 105 is a slide switch which can be operated in the +Z direction, and the battery release switch 105 and the battery locking portions 113a and 113b are integrally formed. Therefore, by sliding the battery release switch 105, it is possible to cause the battery locking portions 113a and 113b to be retracted to positions where the battery locking portions 113a and 113b do not protrude from the battery chamber 104.

As shown in FIG. 2, a battery 112 is removably fitted in the battery chamber 104. In a state of the battery 112 fitted in the battery chamber 104, lug portions, not shown, formed on the battery 112 are engaged with the battery attachment guides 106a and 106b (see FIG. 1A) formed in the battery chamber 104, whereby the battery 112 is restricted to move toward the −Z direction.

Further, the battery locking portions 113a and 113b protruding from the battery chamber 104 support a bottom surface 112a of the battery 112 to retain the battery 112, whereby the battery 112 is held in the battery chamber 104. In this state of the battery 112, shown in FIG. 2, the battery chamber intake port 107 is exposed to the outer appearance, and hence outside air can be drawn in from the battery chamber intake port 107 even in the state in which the battery 112 is fitted.

Figure 4A:
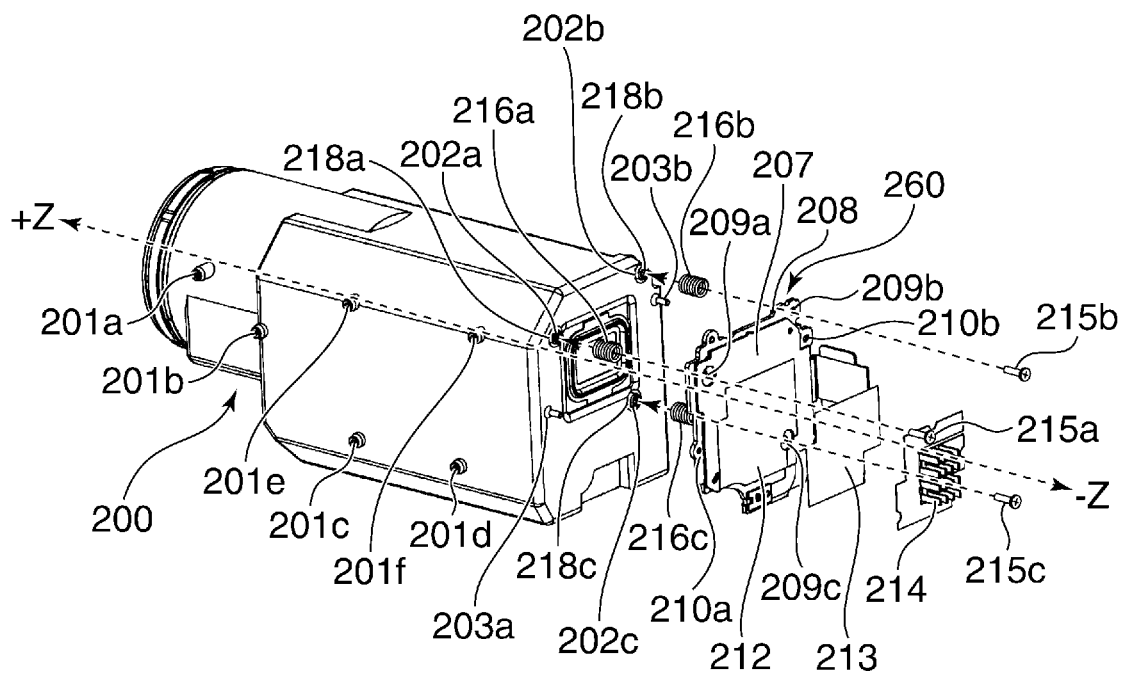
FIG. 4A is a perspective view of the internal structure of the digital video camera, as viewed from the rear.
Figure 4B:
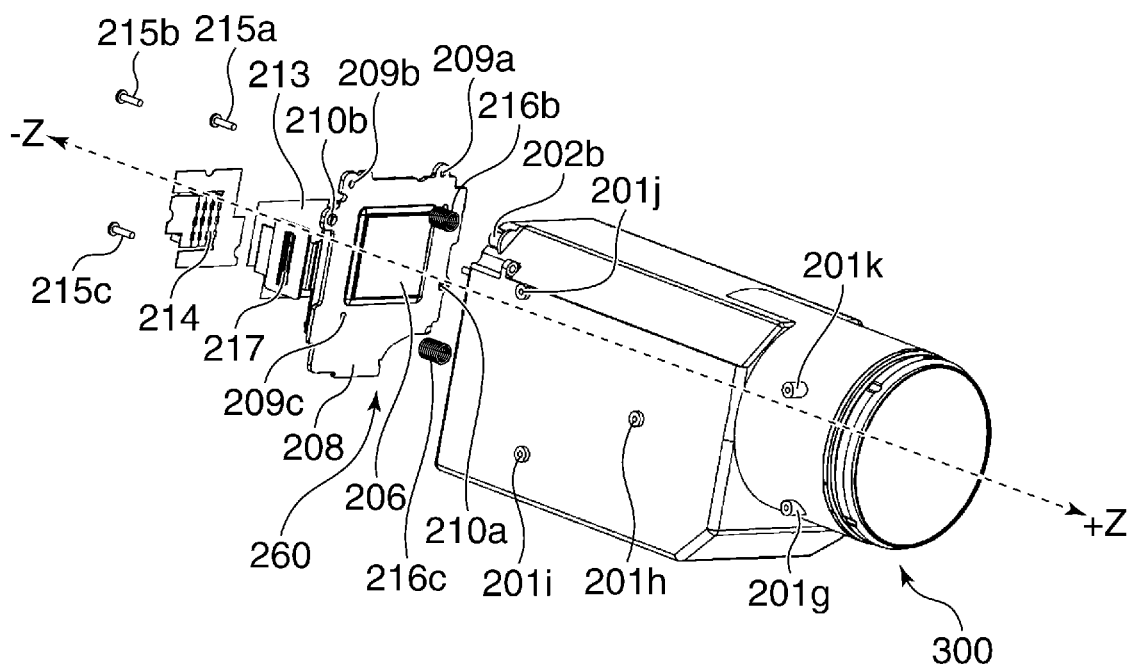
FIG. 4B is a perspective view of the internal structure of the digital video camera, as viewed from the front.
Figure 5:
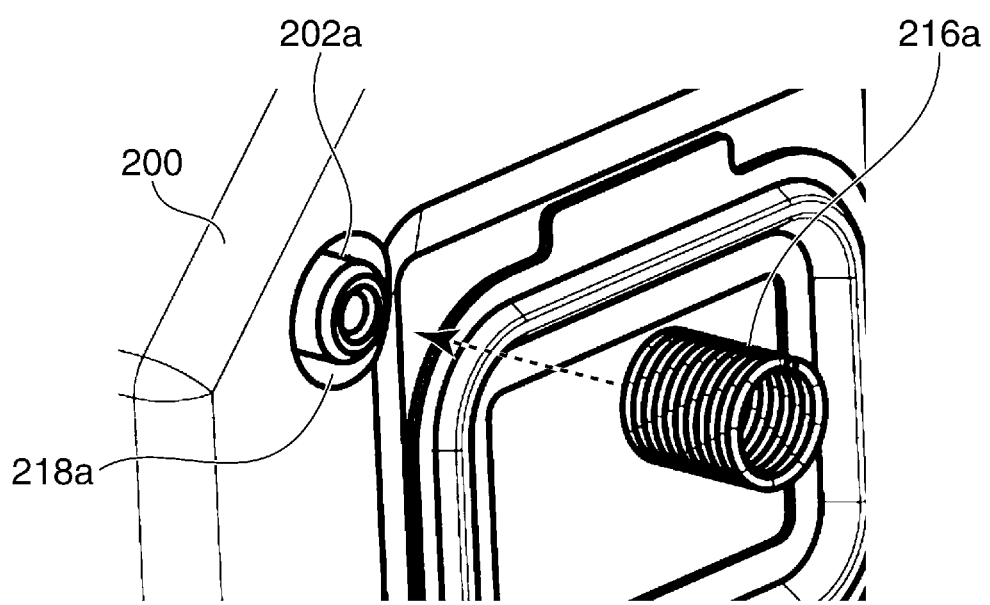
FIG. 5 is a partial enlarged view of FIG. 4A.

Next, the internal structure of the camera 100 will be described with reference to FIGS. 4A and 4B, and 5. FIG. 4A is a perspective view of the internal structure of the camera 100, as viewed from the rear, and FIG. 4B is a perspective view of the internal structure of the camera 100, as viewed from the front. FIG. 5 is a partial enlarged view of FIG. 4A.

As shown in FIGS. 4A and 4B, the camera casing 200 is provided with holder fixing bosses 201a to 201k for fixing a holder sheet metal 500 (see FIGS. 7A, 8, and 10), referred to hereinafter, and sensor fixing bosses 202a to 202c. As shown in FIG. 5, concentric concave portions 218a to 218c, each of which is one size larger than the outer shape of each of the sensor fixing bosses 202a to 202c, are formed around the sensor fixing bosses 202a to 202c, respectively. Adjustment coil springs 216a to 216c are attached to the concave portions 218a to 218c such that they are fitted on the outer shapes of the sensor fixing bosses 202a to 202c, respectively.

Further, an image pickup unit 260 is attached to an end face of the camera casing 200 on the rear side in a state positioned by fitting positioning pins 203a and 203b provided on the camera casing 200 into positioning holes 210a and 210b formed in a sensor attaching sheet metal 208. An image pickup device 206 mounted on a sensor circuit board 207 is integrally fixed to the sensor attaching sheet metal 208 with an adhesive or the like. The sensor circuit board 207 corresponds to an example of a second circuit board as a heat source of the present invention.

Further, a connection connector 217 mounted on the sensor circuit board 207 is electrically connected to the main circuit board 901 (see FIG. 10), described hereinafter, and can send image information acquired from the image pickup device 206 to the main circuit board 901. Part of a surface of the sensor circuit board 207, opposite from the image pickup device 206, forms a copper foil exposed portion 212, and a sheet-type heat conductive adhesive member 213 which is one size smaller than the copper foil exposed portion 212 is affixed to the copper foil exposed portion 212. Heat dissipation fins 214 are attached to the heat conductive adhesive member 213 such that a flange surface 214a (see FIGS. 9A to 9C) of the heat dissipation fins 214 partially or entirely overlaps the image pickup device 206 in the optical axis direction. With this arrangement, the heat dissipation fins 214 are thermally connected to the copper foil exposed portion 212 via the heat conductive adhesive member 213, whereby heat generated by the sensor circuit board 207 is transferred to the heat dissipation fins 214.

Further, the image pickup unit 260 attached to the camera casing 200 is temporarily fixed by inserting adjustment screws 215a to 215c into through holes 209a to 209c of the sensor attaching sheet metal 208, and screwing the same into the sensor attaching bosses 202a to 202c, respectively. Then, after adjusting the angle of the image pickup unit 260 in this state, the image pickup unit 260 is finally fixed to the camera casing 200 with an adhesive or the like.

Figure 6A:
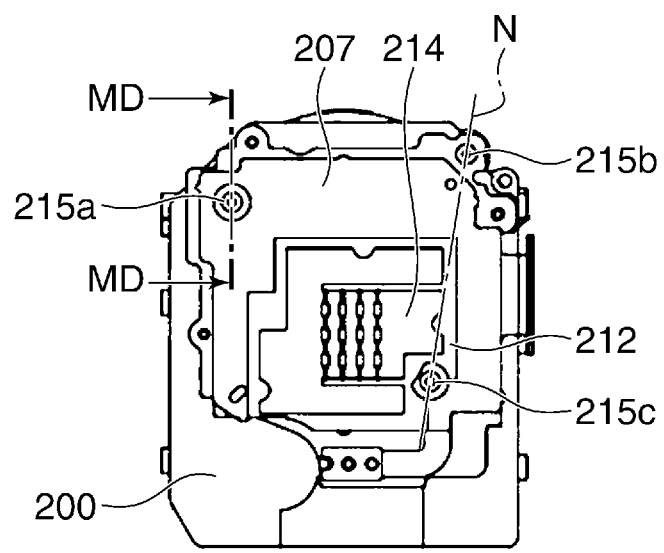
FIGS. 6A to 6C are views useful in explaining an angle adjustment method for an image pickup unit.

Next, a method of adjusting the angle of the image pickup unit 260 will be described with reference to FIGS. 6A to 6C. FIG. 6A is a rear view of the camera casing 200 in a state having the image pickup unit 260 temporarily fixed thereto, FIG. 6B is an enlarged cross-sectional view taken along MD-MD in FIG. 6A, and FIG. 6C is an enlarged cross-sectional view taken along MD-MD in FIG. 6A when the angle of the image pickup unit 260 is adjusted.

Figure 6B:
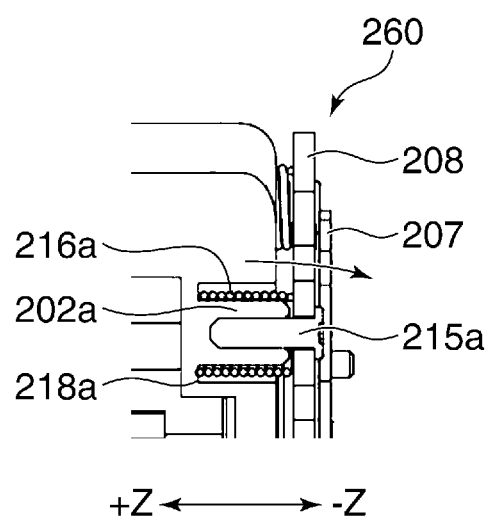
Figure 6C:
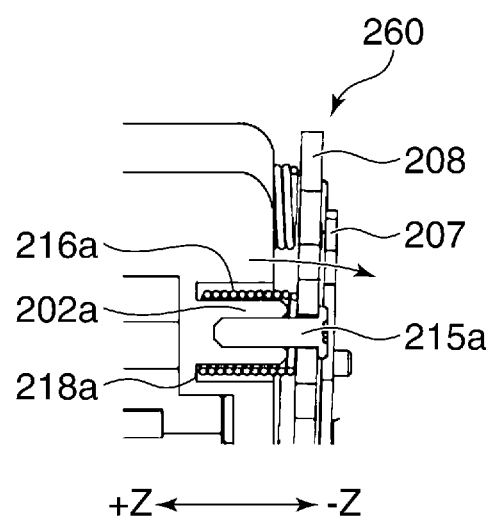

The image pickup unit 260 in a state shown in FIG. 6B is urged in the −Z direction by the adjustment coil spring 216a. When the adjustment screw 215a is loosened in this state, the image pickup unit 260 is pushed outward by the urging force of the adjustment coil spring 216a by an amount corresponding to the loosening of the adjustment screw 215a, and the image pickup unit 260 is inclined about an N-axis, indicated in FIG. 6A, which corresponds to a line connecting between points supported by the adjustment screws 215b and 215c, thereby being changed into a state shown in FIG. 6C.

Similarly, when one of the adjustment screws 215b and 215c is loosened, the image pickup unit 260 is also pushed outward by the urging force of a corresponding one of the adjustment coil springs 216b and 216c, and is inclined. Thus, by adjusting the amount of looseness of each of the adjustment screws 215a to 215c, it is possible to adjust the image pickup unit 260 to a desired position and a desired posture.

Figure 7A:
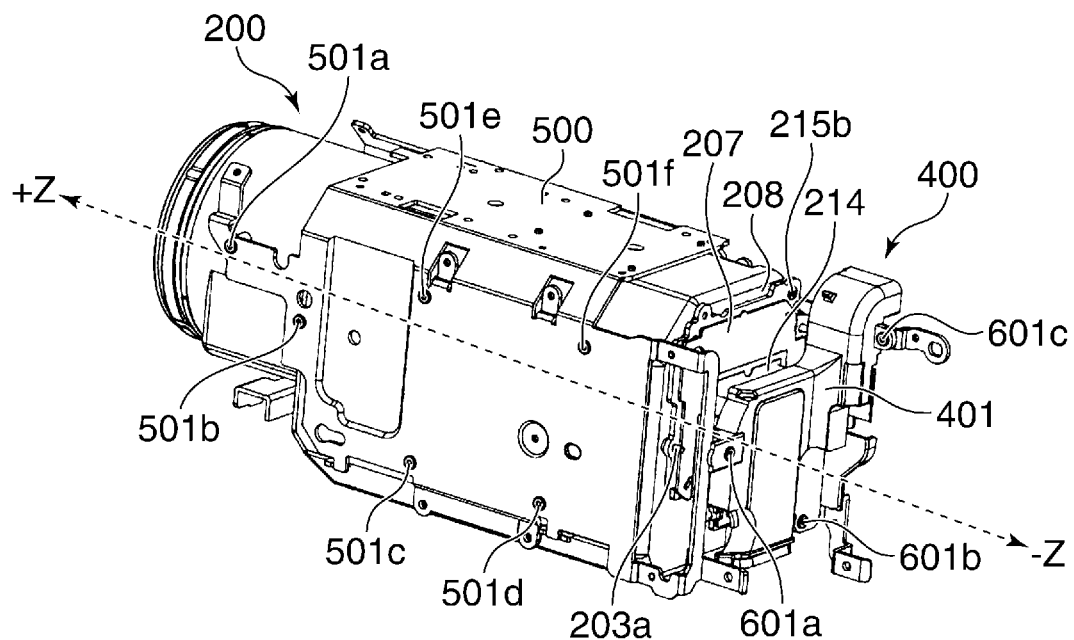
FIG. 7A is a perspective view of a camera casing having a sensor unit mounted thereon, with a holder sheet metal and a sensor duct unit attached thereto.
Figure 7B:
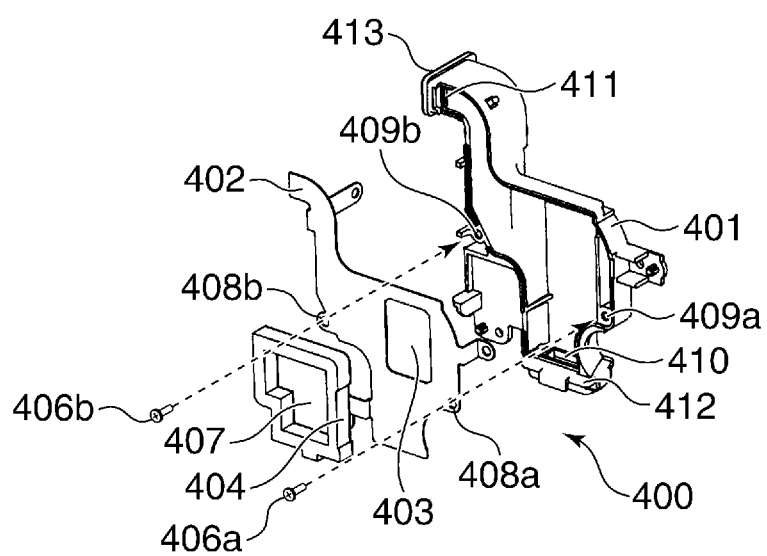
FIG. 7B is an exploded perspective view of the sensor duct unit.

FIG. 7A is a perspective view of the camera casing 200 having the image pickup unit 260 mounted thereon, with the holder sheet metal 500 and a sensor duct unit 400 attached thereto, and FIG. 7B is an exploded perspective view of the sensor duct unit 400.

As shown in FIG. 7A, the holder sheet metal 500 is fixed to the camera casing 200 with screws 501a to 501k (the screws 501g to 501k are not shown) at respective locations corresponding to the holder fixing bosses 201a to 201k (see FIG. 3). Further, the sensor duct unit 400 is fixed to the holder sheet metal 500 with screws 601a to 601c such that the sensor duct unit 400 covers the image pickup unit 260.

The sensor duct unit 400 includes, as shown in FIG. 7B, a sensor duct 401, a sensor duct cover 402, an elastic member 404, an intake port elastic member 412, and an exhaust port elastic member 413, and the sensor duct cover 402 is formed with an opening 403. The opening 403 has an opening area through which tip ends of fin portions 214b of the heat dissipation fins 214 can extend, in an assembled state of the camera 100. The elastic member 404 is affixed to the sensor duct cover 402 e.g. via a double-sided adhesive tape, not shown. The sensor duct 401 corresponds to a second duct of the present invention.

Further, the opening area of an opening 407 of the elastic member 404 is larger than that of the opening 403 of the sensor duct cover 402. The elastic member 404 is arranged along the circumference of the opening 403 of the sensor duct cover 402 such that the elastic member 404 surrounds the opening 403. The sensor duct 401 and the sensor duct cover 402 are integrated by screws 406a and 406b which are screwed into bosses 409a and 409b via through holes 408a and 408b of the sensor duct cover 402, respectively.

Further, the sensor duct 401 is formed with an intake port 410 and an exhaust port 411, and the intake port elastic member 412 and the exhaust port elastic member 413, made of e.g. sponge, which have a low heat conductivity, are affixed to the intake port 410 and the exhaust port 411, respectively, e.g. via a double-sided adhesive tape, not shown. Note that the intake port 410 is associated with the battery chamber intake port 107.

Figure 8:
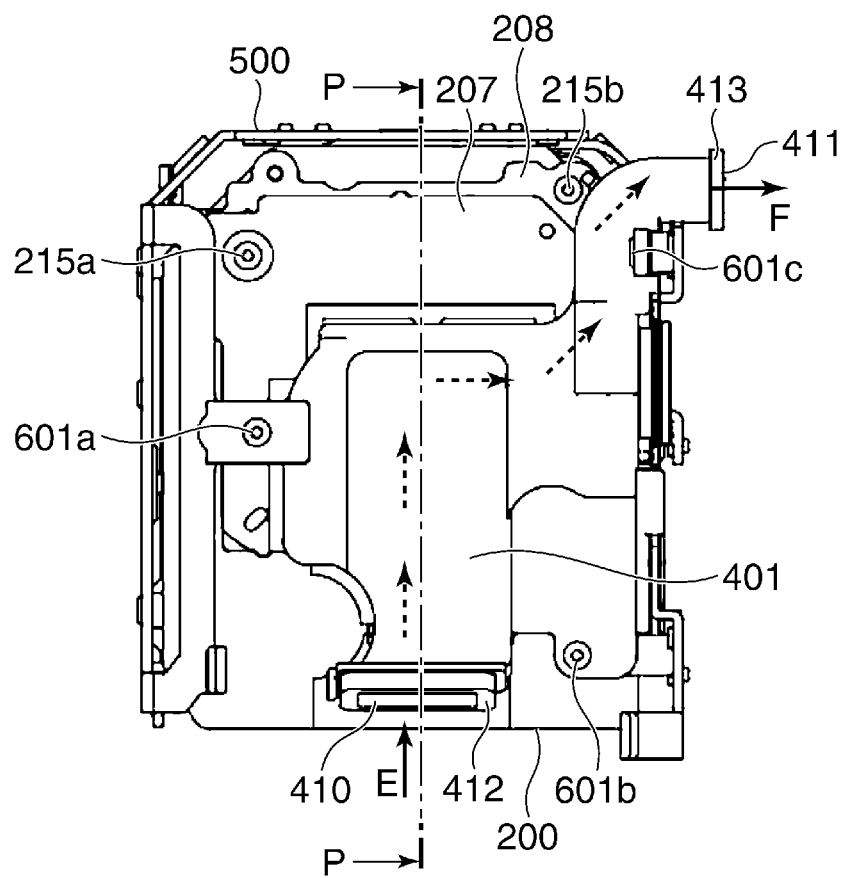
FIG. 8 is a rear view of FIG. 7A.
Figure 9A:
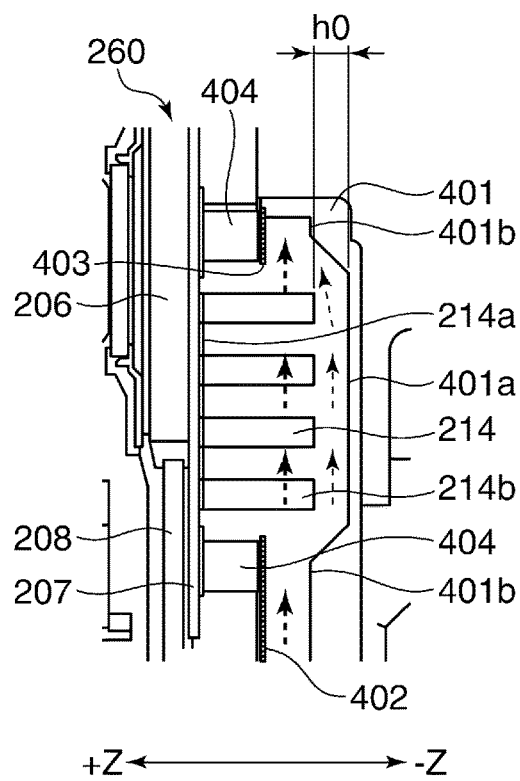
FIGS. 9A to 9C are enlarged cross-sectional views taken along P-P in FIG. 8.

Next, the heat dissipation structure of the image pickup unit 260 using the sensor duct unit 400 will be described with reference to FIGS. 8 and 9A to 9C. FIG. 8 is a rear view of the camera casing 200 in the state shown in FIG. 7A. FIG. 9A is an enlarged cross-sectional view taken along P-P in FIG. 8.

As shown in FIG. 9A, an inner wall surface of the sensor duct 401 is provided with a recess portion 401a which is a region opposed to the heat dissipation fins 214 in the Z direction and formed into a recessed shape so as to secure a clearance between the sensor duct 401 and the tip ends of the fin portions 214b, and a flat portion 401b which is a region other than the recess portion 401a. A distance h0 from each fin portion 214b to the recess portion 401a is set to be larger than an amount of displacement of the image pickup unit 260 in the optical axis direction, which is caused by adjustment of an inclination angle of the image pickup unit 260. Specifically, the distance h0 is set to a distance large enough to prevent the fin portion 214b and the recess portion 401a from being brought into contact with each other e.g. due to movement of the tip end of the fin portion 214b as a result of adjustment of the angle of the image pickup unit 260, or deformation of the recess portion 401a caused e.g. by an impact.

Further, the elastic member 404 is assembled between the flange surface 214a of the heat dissipation fins 214 and the sensor duct cover 402 in a charged state. The charging amount of the elastic member 404 is set to an amount enough to maintain the sealing property from the outside, in whichever of directions including the +Z direction and the −Z direction the image pickup unit 260 may be moved according to the above-mentioned angle adjustment.

The sensor duct unit 400 has the intake port 410 connected to the battery chamber intake port 107 (see FIG. 1A) via the intake port elastic member 412, as shown in FIG. 8. Therefore, air drawn from the battery chamber intake port 107 flows into the intake port 410 in the direction of arrow E in FIG. 8, deprives the sensor circuit board 207 of heat when passing the heat dissipation fins 214 in the sensor duct, continues to flow as indicated by arrows with broken lines, and is then discharged from the exhaust port 411 in the direction of arrow F.

Figure 9B:
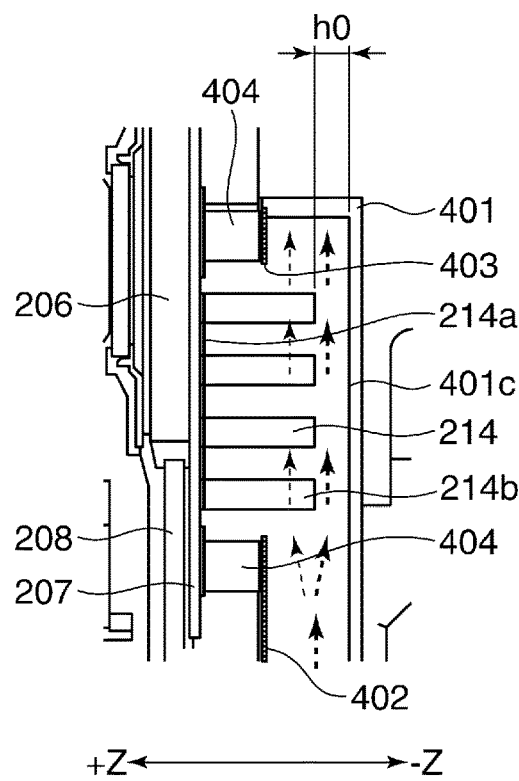

Note that, as shown in FIG. 9B, if a flat portion 401c is entirely spaced from the heat dissipation fins 214, when air flowing into the sensor duct passes the region of the heat dissipation fins 214, a more amount of air flows between the tip ends of the fin portions 214b and the flat portion 401c than between the fin portions 214b, due to a difference in ventilation resistance therebetween. To prevent this, as shown in FIG. 9A, the recess portion 401a is provided so as to restrict flow of air, whereby it is possible to positively cause air to blow against the fin portions 214b of the heat dissipation fins 214.

Figure 9C:
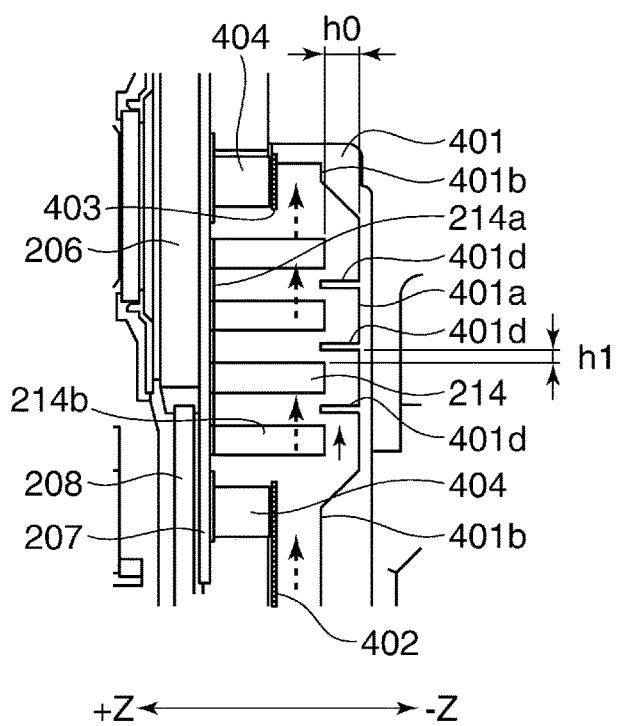

Further, as shown in FIG. 9C, if ribs 401d are formed on the sensor duct 401 so as to obstruct the flow of air between the recess portion 401a and the fin portions 214, e.g. such that the ribs 401d extend in a direction orthogonal to the direction of the flow of air, air becomes difficult to flow in a region corresponding to the distance h0, compared with the structure shown in FIG. 9A. This makes it possible to cause air to more positively blow against the fin portions 214b of the heat dissipation fins 214. The ribs 401d are each disposed between adjacent ones of the fin portions 214b.

Note that it is desirable to secure a sufficient distance for a distance h1 between each fin portion 214b and an associated one of the ribs 401d in a direction orthogonal to the optical axis direction, by taking into account movement of the tip end of the fin portion 214b due to adjustment of the angle of the image pickup unit 260, or deformation of the recess portion 401a, caused e.g. by an impact.

Figure 10:
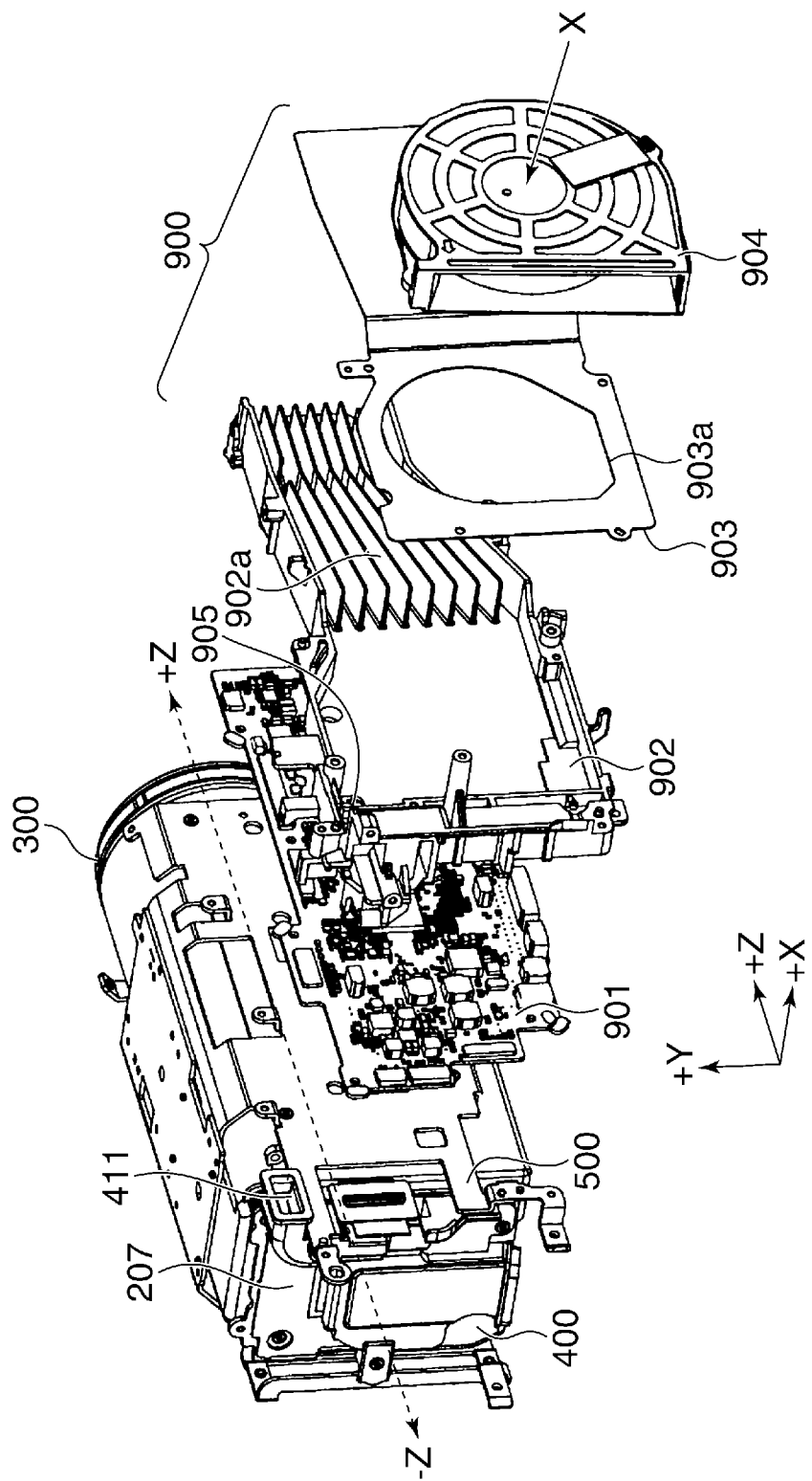
FIG. 10 is an exploded perspective view of the digital video camera in a state in which a main circuit board, a main duct, a main duct cover, and a cooling fan are going to be further assembled to the digital video camera which is in the middle of assembly as shown in FIG. 7A.
Figure 11A:
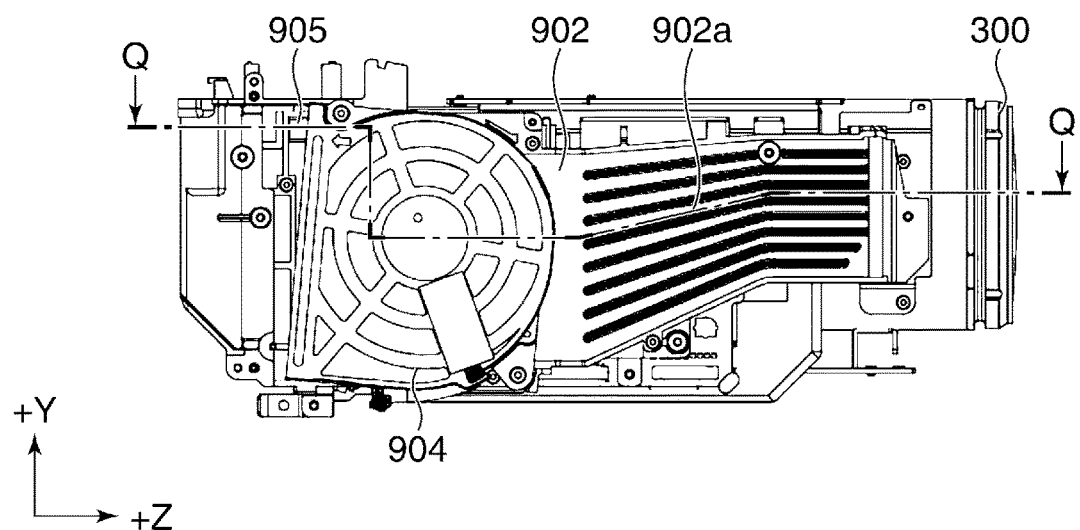
FIG. 11A is a view of the assembly, shown in FIG. 10, as viewed from an X direction.

Next, the internal heat dissipation structure of the camera 100, more particularly, the heat dissipation structure of the main circuit board 901 using the duct unit 900 will be described with reference to FIGS. 10 to 14. FIG. 10 is an exploded perspective view of the camera 100 in a state in which the main circuit board 901, a main duct 902, a main duct cover 903, and a cooling fan 904 are going to be further assembled to the camera 100 which is in the middle of assembly as shown in FIG. 7A. The duct unit 900 is formed by the main duct 902 and the main duct cover 903. FIG. 11A is a view of the assembly, shown in FIG. 10, as viewed from the X direction, and FIG. 11B is a cross-sectional view taken along Q-Q in FIG. 11A. Note that in FIG. 11A, the main duct cover 903 is omitted from illustration for convenience of explanation.

On the left side surface of the camera casing 200 as viewed from the front, the duct unit 900 is arranged on a side of the main circuit board 901 opposite from the camera casing 200. With this arrangement, the position of the gravity center of the camera 100 is closer to the first grip part 114 than the optical axis is, so that it is possible to reduce burden on the hand when the photographer holds the first grip part 114.

The main duct cover 903 is formed with an opening 903a, and the opening 903a is arranged such that a shadow projection thereof overlaps the cooling fan 904, as viewed from the +X direction orthogonal to the optical axis. On the rear surface of the camera casing 200, the sensor circuit board (sensor flexible printed wiring board) 207, on which a sensor, not shown, is mounted, is fixed e.g. with screws, and further, the holder sheet metal 500 is fixed to the camera casing 200 such that it surrounds the top surface and the opposite side surfaces of the camera casing 200.

As shown in FIG. 10, between the holder sheet metal 500 and the duct unit 900, the main circuit board 901 is disposed on a plane substantially parallel to the side surface of the camera casing 200, i.e. on a plane substantially orthogonal to a plane on which the sensor circuit board 207 is disposed. A side of the main circuit board 901, facing the holder sheet metal 500, is thermally connected to the holder sheet metal 500 via a heat conductive elastic member, not shown. Similarly, a side of the main circuit board 901, facing the main duct 902, is thermally connected to the main duct 902 via a heat conductive elastic member, not shown.

With this arrangement, heat generated by the main circuit board 901 is dissipated through two paths: a path along which the heat is diffused into the camera 100 via the holder sheet metal 500, and a path along which air is discharged to the outside via the main duct 902 and the cooling fan 904 by forced cooling. Further, to enhance the effect of heat diffusion into the camera 100 via the holder sheet metal 500, the holder sheet metal 500 is formed of a material having a high heat conductivity, such as an aluminum alloy, and is formed such that an area surrounding the camera casing 200 becomes as large as possible. The main circuit board 901 corresponds to a first circuit board (circuit board) as a heat source of the present invention, and the main duct 902 corresponds to a first duct of the present invention.

Next, the forced cooling structure using the duct unit 900 and the cooling fan 904 will be described with reference to FIGS. 11A and 11B. The cooling fan 904 is formed e.g. by a centrifugal fan.

The main duct 902 includes a flat portion 902b which is substantially parallel to the main circuit board 901, and heat dissipation fins 902a formed on the flat portion 902b. As shown in FIG. 11B, the main duct cover 903 has the opening 903a for causing air to flow into the cooling fan 904, a flat portion 903b which is opposed to the heat dissipation fins 902a and of which a shadow projection does not overlap the cooling fan 904 in the +X direction, and a flat portion 903c which is opposed to a region of the main duct 902, where the heat dissipation fins 902a are not provided, and of which a shadow projection overlaps the cooling fan 904 in the +X direction. Further, a surface of the cooling fan 904, which is farthest from the flat portion 903c of the main duct cover 903 in the X direction is defined as a flat portion 904b. Note that the cooling fan 904 is formed e.g. by a centrifugal fan. Further, the cooling fan 904 is attached to the main duct 902 such that a rotational axis PR is substantially perpendicular to the main circuit board 901.

Here, a distance from the flat portion 902b of the main duct 902 to the flat portion 903b of the main duct cover 903 (height of the heat dissipation fins 902a) is represented by h2, a distance from the flat portion 902b to the flat portion 903c of the main duct cover 903 is represented by h3, and a distance from the flat portion 902b to the flat portion 904b is represented by h4.

Figure 11B:
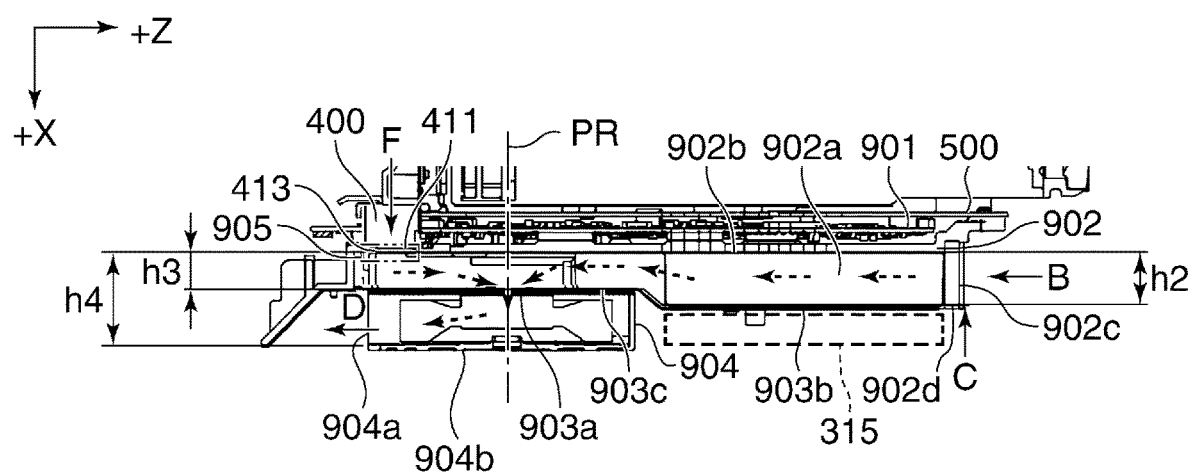
FIG. 11B is a cross-sectional view taken along Q-Q in FIG. 11A.

Air flows within the main duct 902 such that first, air is drawn from the direction of arrow B and the direction of arrow C in FIG. 11B via the intake port 902c and an intake port 902d, and the drawn air passes a space between the flat portion 902b and the flat portion 903b. The air passing the space between the flat portion 902b and the flat portion 903b deprives the heat dissipation fins 902a of heat, flows into the cooling fan 904 via a space between the flat portion 902b and the flat portion 903c, and is then discharged from the exhaust port 904a of the duct unit 900 in the direction of arrow D. The intake ports 902c and 902d are associated with the intake ports 108a and 108b, appearing in FIG. 1B, respectively, and the exhaust port 904a is associated with the exhaust port 109, appearing in FIG. 1B.

Incidentally, the ventilation resistance of air mainly depends on a cross-sectional area of an air flow passage, and hence in the region in which the heat dissipation fins 902a are arranged, the air flow passage is narrowed by an area corresponding to the cross section of the heat dissipation fins 902a. Therefore, assuming that the region in which the heat dissipation fins 902a are arranged and the region in which the heat dissipation fins 902a are not arranged have substantially the same flow passage cross-sectional area, it is possible to reduce the dimension in the height direction of the region in which the heat dissipation fins 902a are not arranged by an amount corresponding to the cross section of the heat dissipation fins 902a (h2−h3). Further, the distance h2 does not include the thickness of the cooling fan 904, and hence h4>h2 holds. That is, a space is formed in a region 315 in FIG. 11B.

As a result, it is possible to dispose the cooling fan 904 at a location closer to the optical axis, in other words, to a lower height than the height of the heat dissipation fins 902a, and hence it is possible to reduce the size of the main duct 902 including the cooling fan 904. Further, by arranging the heat dissipation structure of the main duct 902 including the cooling fan 904, which is reduced in size, within the first grip part 114, the first grip part 114 can be made closer to the optical axis. With this arrangement, the position of the gravity center of the camera 100 and the first grip part 114 are made closer to each other, which makes the camera 100 easier to hold.

Further, the main duct 902 is formed with a duct connection opening 905 for connection to the exhaust port 411 of the sensor duct unit 400. The duct connection opening 905 is disposed at a location on an opposite side of the rotational axis PR of the cooling fan 904 from the air flow passage through which air drawn in from the direction of arrow B and the direction of arrow C in FIG. 11B flows toward the cooling fan 904. With this arrangement, air drawn in from the direction of arrow B and the direction of arrow C and flowing toward the cooling fan 904 and air flowing from the exhaust port 411 of the sensor duct unit 400 toward the cooling fan 904 in the direction of arrow F are guided to the cooling fan 904 without obstructing each other. Therefore, it is possible to efficiently join the flows of air from the two directions and discharge the air.

Further, air heated through the heat dissipation fins 902a flows toward the cooling fan 904, and hence the air is difficult to flow toward the duct connection opening 905 disposed at a location on an opposite side of the cooling fan 904 from the heat dissipation fins 902a. Further, the exhaust port 411 and the duct connection opening 905 are in contact with each other only via the exhaust port elastic member 413 which is lower in heat conductivity than the main duct 902 and the sensor duct 401. This makes it possible to reduce heat transferred from the main duct 902 to the sensor duct unit 400 through the duct connection opening 905 to the minimum.

The main duct 902 is formed by a aluminum die-cast component which has a high heat conductivity and a high rigidity. The first grip belt holder 117 and the second grip belt holder 118 are mechanically connected to the main duct 902 e.g. with screws. This causes the first grip belt holder 117 and the second grip belt holder 118 to be mechanically connected to the main duct 902 which is a highly rigid one-piece component, and hence have a high strength.

Further, the metal members of the first grip belt holder 117 and the second grip belt holder 118 are mechanically connected to the main duct 902 in a state subjected to bending at least once, e.g. with screws. This makes it possible to reduce impact transmitted from the first grip belt holder 117 and the second grip belt holder 118 to the main duct 902.

As described above, in the present embodiment, air drawn in from the direction of arrow B and the direction of arrow C and flowing toward the cooling fan 904 and air flowing from the exhaust port 411 of the sensor duct unit 400 toward the cooling fan 904 in the direction of arrow F are guided to the cooling fan 904 without obstructing each other. This makes it possible to efficiently join the flows of airs from the two directions and discharge the air, and thereby efficiently cool the image pickup device 206 and the main circuit board 901 simultaneously using one cooling fan 904.

Figure 12:
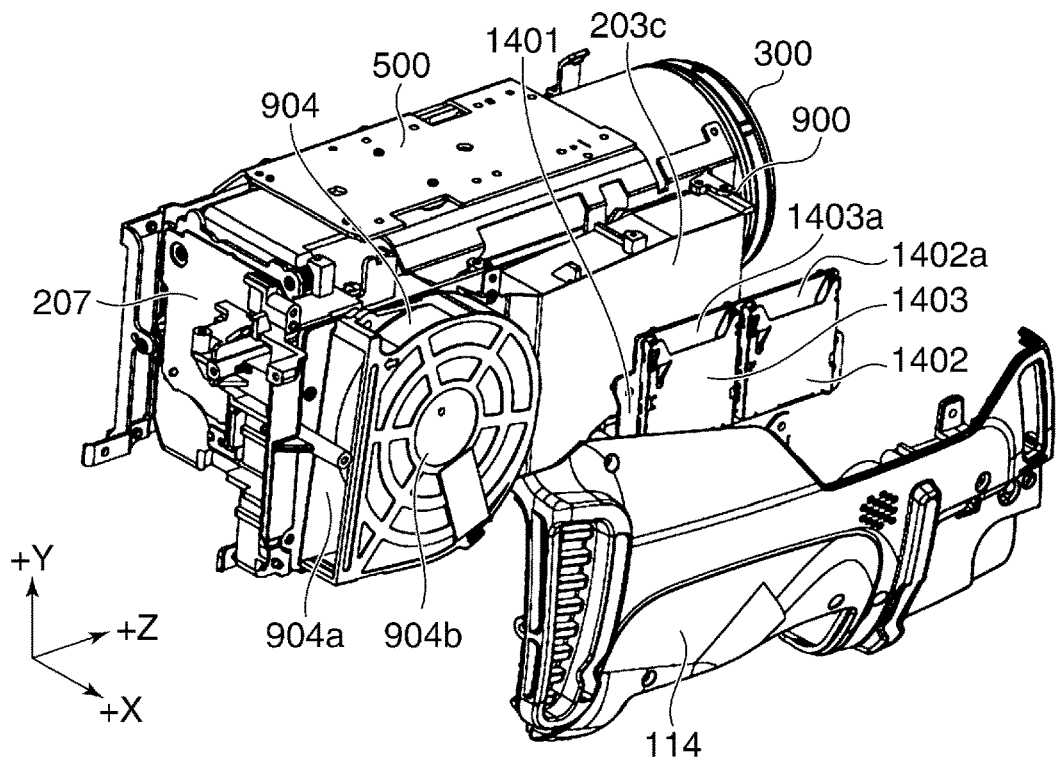
FIG. 12 is an exploded perspective view of the digital video camera in a state in which a card board having card connectors mounted thereon is going to be further assembled to the digital video camera which is in the middle of assembly as shown in FIG. 10.

FIG. 12 is an exploded perspective view of the camera 100 in a state in which a card circuit board 1401 on which the card connectors 1402 and 1403 have been mounted is going to be further assembled to the camera 100 which is in the middle of assembly as shown in FIG. 10.

As shown in FIG. 12, the card circuit board 1401 is attached to an inner surface of the first grip part 114 in advance, and the first grip part 114 on which the card circuit board 1401 has been attached is fastened to the duct unit 900 with screws, not shown. With this arrangement, the card circuit board 1401 is indirectly attached to the duct unit 900 with a clearance from the duct unit 900, whereby it is possible to prevent heat from the duct unit 900 from being directly transferred to the card circuit board 1401 and the card connectors 1402 and 1403. Although in the present embodiment, the two card connectors are arranged, one or three or more card connectors may be arranged.

Figure 13:
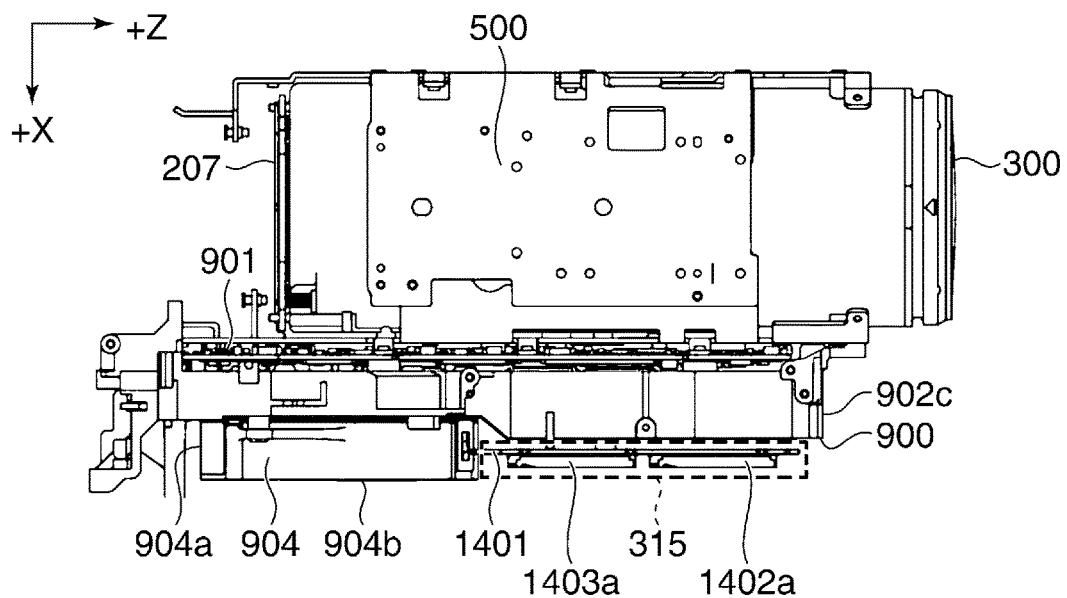
FIG. 13 is a top view of the digital video camera in a state having the card board assembled thereto.
Figure 14:
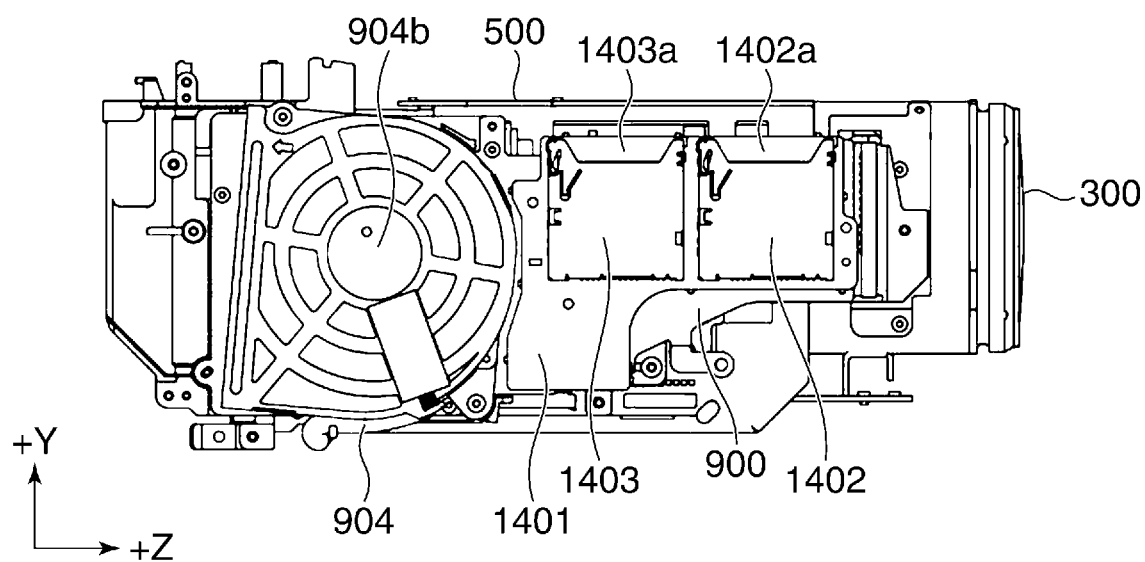
FIG. 14 is a side view of a left side of the digital video camera, as viewed from the front, in the state shown in FIG. 13.

FIG. 13 is a top view of the camera 100 in a state having the card circuit board 1401 assembled thereto. FIG. 14 is a side view of a left side of the camera 100, as viewed from the front, in the state shown in FIG. 13. Note that in FIGS. 13 and 14, the first grip part 114 is omitted from illustration for convenience of explanation.

As shown in FIGS. 13 and 14, the card circuit board 1401 is arranged in a space formed in the region 315. Thus, by properly arranging the duct unit 900, the cooling fan 904, and the card circuit board 1401, it is possible to realize an efficient and compact construction. Further, since the card circuit board 1401 is disposed on a side of the duct unit 900 toward the intake port 902c which is lower in temperature, it is possible to reduce an influence of heat of the duct unit 900 on the memory cards inserted in the card connectors 1402 and 1403 to the minimum. Note that the connector opening 1402a and a connector opening 1403a of the card connectors 1402 and 1403 mounted on the card circuit board 1401 face upward, which makes it possible to vertically insert and remove memory cards.

As described above, in the present embodiment, the duct unit 900 is disposed on the side of the camera casing 200 toward the first grip part 114. Therefore, the position of the gravity center of the camera 100 is displaced from the optical axis toward the first grip part 114, so that it is possible to reduce burden on the hand when the photographer holds the first grip part 114.

Further, in the present embodiment, the card circuit board 1401 is disposed in the space formed in the region 315 where the thickness of the cooling fan 904 of the duct unit 900 is not included. This makes it possible to realize an efficient and compact construction, by properly arranging the duct unit 900, the cooling fan 904, and the card circuit board 1401, and hence to further reduce the size of the camera 100.

Further, in the present embodiment, since the card circuit board 1401 is disposed on a side of the duct unit 900 closer to the intake port 902c which is lower in temperature, it is possible to reduce an influence of heat of the duct unit 900 on the memory cards inserted in the card connectors 1402 and 1403 to the minimum.

Further, in the present embodiment, it is possible to reduce heat transferred from the inside of the camera 100 to the card cover 706, by the heat insulation effect obtained by the air layer in the space 715 formed between the card cover 706 provided for covering the connector openings 1402a and 1403a such that it can be opened and closed, and the top cover 712. This makes it possible to ease an uncomfortable feeling felt by the photographer when he/she holds the camera 100 and touches the card cover 706.

Therefore, in the present embodiment, it is possible to realize size reduction of the camera 100 employing the forced cooling structure, by arranging the cooling fan 904 and the card connectors 1402 and 1403 in the optimum positions while taking into account a weight balance of the camera 100 held by a photographer.

Figure 15A:
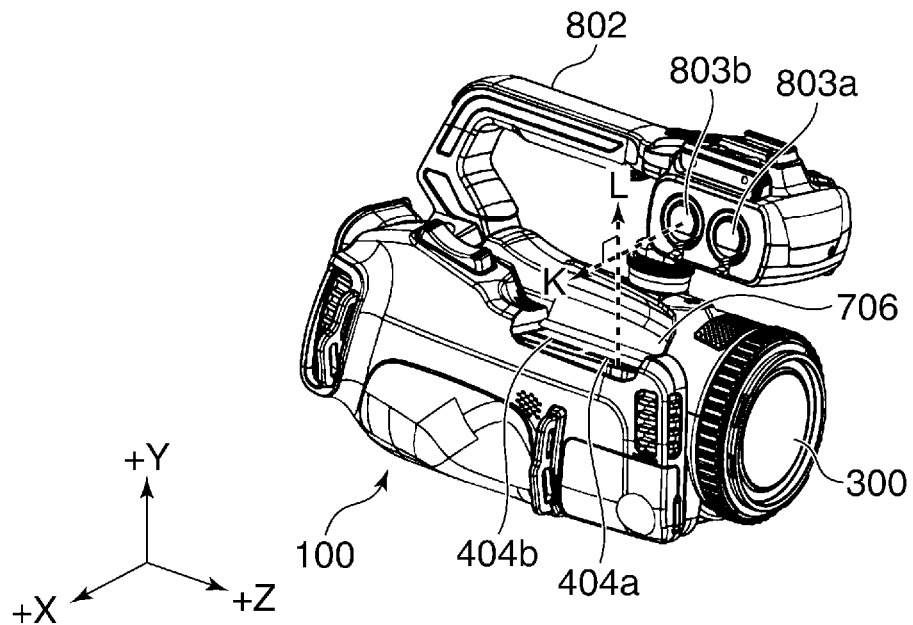
FIG. 15A is a perspective view of a digital video camera as an image pickup apparatus (electronic apparatus) according to a second embodiment of the invention, as viewed obliquely from the front.
Figure 15B:
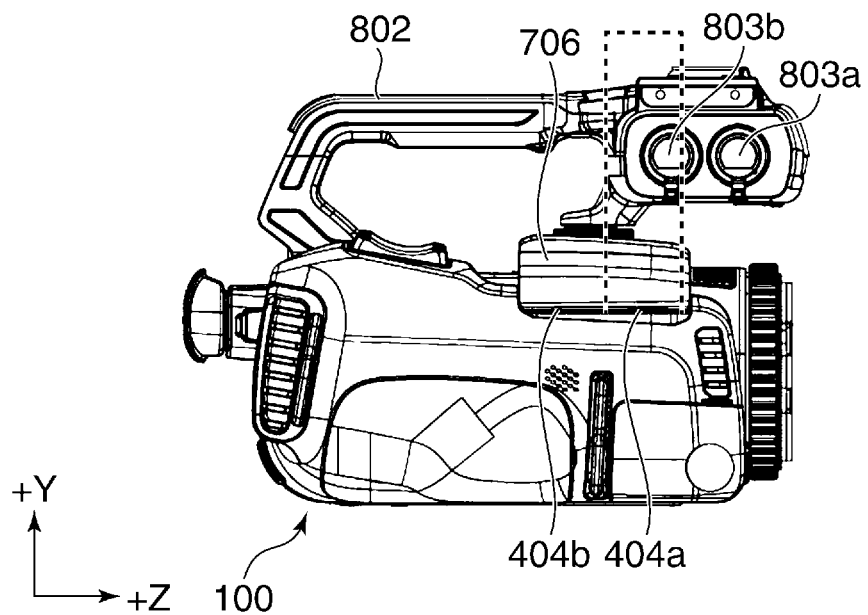
FIG. 15B is a side view of a left side of the digital video camera, as viewed from the front, in the state shown in FIG. 15A.

Next, a digital video camera as an electronic apparatus (image pickup apparatus) according to a second embodiment of the invention will be described with reference to FIGS. 15A to 16B. FIG. 15A is a perspective view of the camera as viewed from the front, and FIG. 15B is a side view of a left side of the camera, as viewed from the front. In the present embodiment, the same components as those of the first embodiment are denoted by the same reference numerals, and description thereof is omitted. Note that both in FIGS. 15A and 15B, the card cover 706 is illustrated in the opened state.

The camera 100 according to the present embodiment has a handle unit 802 integrally and removably attached to the top thereof. The handle unit 802 is provided with external input/output terminals 803a and 803b. The external input/output terminals 803a and 803b are located above card slots 1404a and 1404b of the camera 100, and a direction K of inserting and removing a plug into and from each of the external input/output terminals 803a and 803b and a direction L of inserting and removing a memory card into and from each of the card slots 1404a and 1404b are orthogonal to each other.

Further, as shown in FIG. 15B, the external input/output terminal 803b is arranged such that a shadow projection of the external input/output terminal 803b partially overlaps a region extended from a region required for inserting and removing a memory card into and from the card slot 1404a, as viewed from a side of the camera 100, i.e. as viewed from the plug inserting/removing direction of the external input/output terminal 803b.

Figure 16A:
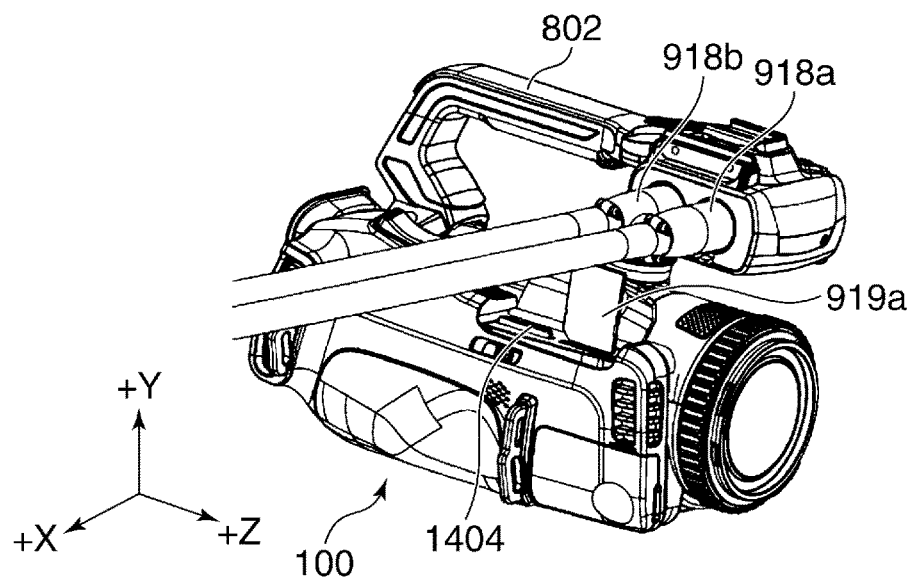
FIG. 16A is a perspective view of the digital video camera shown in FIG. 15A, in a state in which the memory card has been taken out from a card slot, with input/output plugs inserted in external input/output terminals, as viewed obliquely from the front.
Figure 16B:
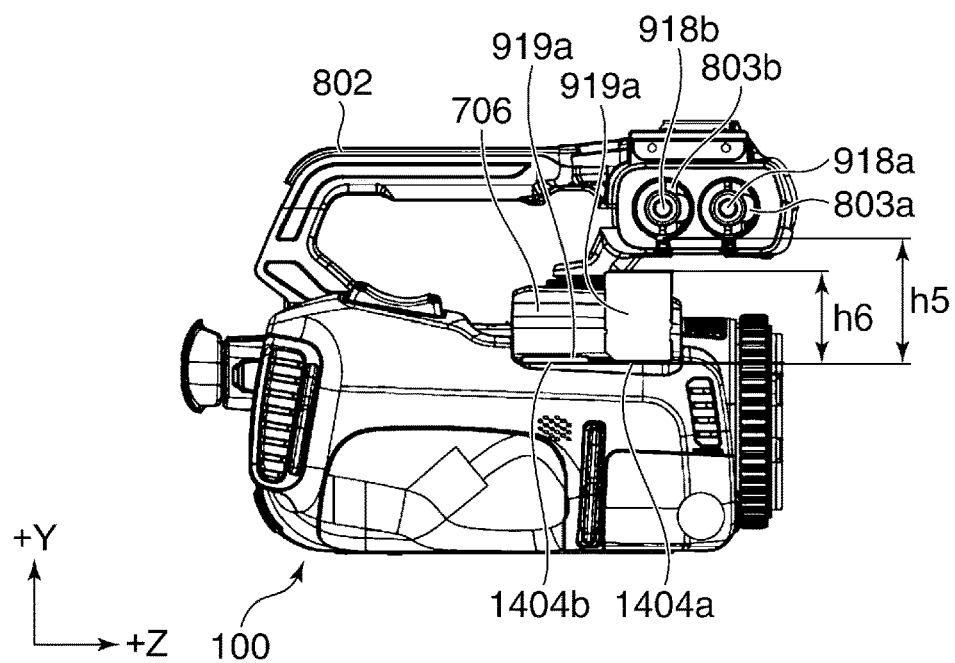
FIG. 16B is a side view of a left side of the digital video camera, as viewed from the front, shown in FIG. 16A.

FIGS. 16A and 16B are views of the camera 100 corresponding to FIGS. 15A and 15B, respectively, in a state in which a memory card 919a has been taken out from the card slot 1404a, with input/output plugs 918a and 918b inserted in the external input/output terminals 803a and 803b, respectively.

Here, as shown in FIG. 16B, when a distance from the card slot 1404a to the external input/output terminal 803b is represented by h5, the distance h5 is longer than a length h6 of the memory card 919a in the inserting/removing direction. This makes it possible to insert and remove the memory card 919a even when the input/output plug 918b has been inserted in the external input/output terminal 803b.

As described above, in the present embodiment, a proper clearance is set between the card slots 1404a and 1404b and the external input/output terminals 803a and 803b, whereby it is possible to realize size reduction of the camera 100 even with the handle unit 802 integrally attached to the camera 100, within a range in which the operability is not impaired. Other components and advantageous effects are the same as those provided by the first embodiment.

Note that the present invention is not limited to the above-described embodiments, but the materials, shapes, sizes, forms, numbers, and arrangement positions of components described in the embodiments by way of example can be changed without departing from the spirit and scope of the present invention.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Applications No. 2017-122215 filed Jun. 22, 2017, No.

2017-122217 filed Jun. 22, 2017, and No. 2017-122219 filed Jun. 22, 2017, which are hereby incorporated by reference herein in their entirety.

What is claimed is:

1. An electronic apparatus comprising:
a body unit;
a first circuit board that is arranged substantially in parallel to a side surface of the body unit and is a heat source;
a second circuit board that is disposed on a plane orthogonal to the side surface of the body unit and is a heat source;
a first duct that has a first intake port and a first flow passage formed therein for cooling the first circuit board;
a second duct that has a second intake port, a first exhaust port, and a second flow passage formed therein to connect with the first flow passage formed in the first duct for cooling the second circuit board; and
a cooling fan that is attached to the first duct and has a second exhaust port for discharging air flowing into the first flow passage of the first duct,
wherein the first duct is provided with an opening that is connected to the first exhaust port of the second duct and introduces air discharged from the first exhaust port of the second duct into the first flow passage of the first duct to be discharged from the second exhaust port.

2. The electronic apparatus according to claim 1, wherein the cooling fan is fixed to the first duct such that a rotational axis thereof is substantially perpendicular to the first circuit board, and the opening is provided at a location on an opposite side of the rotational axis from the first intake port of the first duct.

3. The electronic apparatus according to claim 1, wherein the first exhaust port of the second duct and the opening are in contact via an elastic member having a lower heat conductivity than the first duct and the second duct.

4. The electronic apparatus according to claim 1, wherein heat dissipation fins are formed in the first flow passage of the first duct at a location closer to the first intake port of the first duct than the cooling fan, and the cooling fan is disposed to a lower height than a height of the heat dissipation fins.

5. The electronic apparatus according to claim 4, wherein the first duct is formed such that a region in which the heat dissipation fins are arranged and a region in which the heat dissipation fins are not arranged have substantially the same flow passage cross-sectional area.

6. The electronic apparatus according to claim 1, wherein an image pickup device is mounted on the second circuit board.

7. The electronic apparatus according to claim 6, wherein the electronic apparatus includes a grip part held by a user, and the first duct including the cooling fan is arranged inside the grip part.

8. The electronic apparatus according to claim 1, wherein the electronic apparatus is an image pickup apparatus, the electronic apparatus further comprising:
a card board disposed at a location which is opposed to an opposite side of the first duct from the first circuit board and is away from the cooling fan in an optical axis direction, the card board having a card connector mounted thereon; and
an exterior cover that is arranged to cover the cooling fan and the card board, and forms part of an exterior, wherein the first circuit board is arranged on the side surface of the body unit substantially in parallel to the optical axis,
wherein the first duct is arranged such that the first circuit board is sandwiched between the body unit and the first duct, and
wherein the cooling fan is arranged to be opposed to the opposite side of the first duct from the first circuit board.

9. The electronic apparatus according to claim 8, wherein the card board is arranged to be opposed to the first duct with a clearance from the first duct.

10. The electronic apparatus according to claim 8, wherein the card board is provided on the body unit at a location closer to an object in the optical axis direction.

11. The electronic apparatus according to claim 8, wherein a plurality of heat dissipation fins are provided on a side of the first duct, which is opposed to the card board.

12. The electronic apparatus according to claim 8, wherein a card slot of the card connector, into which a memory card is inserted, faces upward, and a card cover for covering the card slot is provided such that the card cover can open and close the card slot.

13. The electronic apparatus according to claim 8, wherein the card connector is mounted in plurality on the card board.

14. The electronic apparatus according to claim 12, wherein a handle unit including an input/output terminal is attached to the image pickup apparatus, a direction of inserting and removing a plug into and from the input/output terminal and a direction of inserting and removing a memory card into and from the card connector are substantially orthogonal to each other, the input/output terminal is arranged such that a shadow projection of the input/output terminal at least partially overlaps a region extended from a region required for inserting and removing the memory card into and from the card slot, as viewed from the plug inserting/removing direction of the input/output terminal, and the input/output terminal is disposed at a location where the memory card can be inserted and removed into and from the card connector even in a state in which the plug has been inserted into the input/output terminal.

15. The electronic apparatus according to claim 1, wherein the electronic apparatus is an image pickup apparatus, the electronic apparatus further comprising:
an operation button that is provided on a rear side of the body unit in the optical direction and can be subjected to a pushing-in operation with a thumb of a user;
a first grip part that is provided on a plane substantially parallel to the optical axis, and includes a grip main surface with which a palm of the user is brought into contact when the user grips the electronic apparatus; and
a second grip part that is arranged to extend from a plane on which the operation button is disposed, toward the first grip part, and has a shape protruding in a direction substantially orthogonal to the optical axis with respect to the grip main surface, the second grip part being provided for being gripped by the thumb with which the user subjects the operation button to the pushing-in operation and a forefinger of the user,
wherein the second grip part is formed with a ventilation portion for air for cooling an inside of the image pickup apparatus, for heat dissipation.

16. The electronic apparatus according to claim 15, wherein the ventilation portion is an exhaust port for discharging air having deprived the inside of the image pickup apparatus of heat.

17. The electronic apparatus according to claim 15, wherein the operation button is a recording button.

18. The electronic apparatus according to claim 15, further comprising a first grip belt holder and a second grip belt holder, to which is attached a grip belt for holding a hand of the user, which grips the first grip part and the second grip part,
wherein the first grip belt holder is disposed in a region of the second grip part at a location closer to the first grip part than the ventilation portion, and
wherein the second grip belt holder is disposed at a location closer to a front side of the body unit than the first grip part.

19. The electronic apparatus according to claim 15, wherein the first grip belt holder and the second grip belt holder are mechanically connected to the first duct.

20. The electronic apparatus according to claim 19, wherein the first grip belt holder and the second grip belt holder are each constructed such that a metal member is at least partially covered with resin.

21. The electronic apparatus according to claim 20, wherein the metal members of the first grip belt holder and the second grip belt holder are mechanically connected to the first duct in a state subjected to bending at least once.

22. The electronic apparatus according to claim 18, wherein the first grip belt holder and the second grip belt holder each have a hole for inserting a grip belt and a hole for inserting a strap belt, formed therethrough.

23. The electronic apparatus according to claim 22, wherein the hole for inserting the strap belt is disposed at a location upward of the hole for inserting the grip belt.

24. The electronic apparatus according to claim 23, wherein the hole for inserting the strap belt has a slot shape which is long in a height direction of the image pickup apparatus, orthogonal to the optical axis, and the hole for inserting the grip belt has a slot shape having a top end side inclined outward in a width direction of the image pickup apparatus with respect to the hole for inserting the strap belt.

25. The electronic apparatus according to claim 22, wherein the hole formed in the first grip belt holder for inserting the strap belt and the hole formed in the second grip belt holder for inserting the strap belt are arranged at respective locations spaced from each other in a height direction of the image pickup apparatus across the optical axis.

26. An image pickup apparatus comprising:
a body unit;
a first circuit board that is arranged substantially in parallel to a side surface of the body unit;
a second circuit board that is disposed on a plane orthogonal to the first circuit board;
a first duct that is arranged to be in contact with the first circuit board;
a second duct that is connected to the first duct, is arranged to be in contact with the second circuit board, and is disposed such that a second flow passage formed in the second duct connects with a first flow passage formed in the first duct; and
a cooling fan that is attached to the first duct to discharge the air flowing into the first flow passage and the second flow passage.

27. The image pickup apparatus according to claim 26, wherein the first duct is arranged substantially in parallel to the first circuit board, and the second duct is arranged substantially in parallel to the second circuit board.

28. An image pickup apparatus comprising:
a body unit including at least one top surface, at least one bottom surface, at least one front surface, at least one rear surface, and at least one side surface as viewed along an optical axis direction;
a first circuit board that is arranged in a first plane substantially in parallel to the at least one side surface of the body unit;
a first duct that is arranged to be in direct contact with the first circuit board; and
a cooling fan that is attached to the first duct such that a rotational axis thereof is substantially perpendicular to the first plane.

29. The image pickup apparatus according to claim 28, wherein the first duct is arranged substantially in parallel to the first circuit board.

* * * * *